United States Patent
Wang (10) Patent No.: US 11,139,152 B2
(45) Date of Patent: Oct. 5, 2021

(54) SUBSTRATE PROCESSING APPARATUS

(71) Applicant: PSK INC., Hwaseong-si (KR)

(72) Inventor: Hung Sheng Wang, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 246 days.

(21) Appl. No.: 16/597,305

(22) Filed: Oct. 9, 2019

(65) Prior Publication Data

US 2020/0350147 A1 Nov. 5, 2020

(30) Foreign Application Priority Data

Apr. 30, 2019 (KR) .................. 10-2019-0050677

(51) Int. Cl.
*H01J 37/32* (2006.01)
*H01L 21/67* (2006.01)
*C23C 16/44* (2006.01)

(52) U.S. Cl.
CPC .... *H01J 37/32871* (2013.01); *C23C 16/4401* (2013.01); *C23C 16/4402* (2013.01); *H01J 37/32715* (2013.01); *H01J 37/32834* (2013.01); *H01L 21/67069* (2013.01); *H01J 2237/022* (2013.01); *H01J 2237/334* (2013.01)

(58) Field of Classification Search
CPC .......... H01J 37/32871; H01J 37/32834; H01J 37/32715; H01J 2237/334; H01J 2237/022; H01J 37/32449; H01J 37/32458; H01J 37/3244; H01L 21/67069; H01L 21/67167; C23C 16/4401; C23C 16/4402
See application file for complete search history.

(56) References Cited

U.S. PATENT DOCUMENTS

| 6,179,920 B1* | 1/2001 | Tarutani ............ C23C 16/45512 118/715 |
| 9,514,919 B2* | 12/2016 | Yang ................. H01J 37/32633 |
| 10,395,898 B2* | 8/2019 | Kim .................. H01J 37/32339 |
| 2006/0046470 A1* | 3/2006 | Becknell .......... H01J 37/32522 438/637 |
| 2008/0178807 A1* | 7/2008 | Wang ...................... C23F 4/00 118/723 R |

(Continued)

FOREIGN PATENT DOCUMENTS

| JP | H0272620 A | 3/1990 |
| JP | H04237123 A | 8/1992 |

(Continued)

OTHER PUBLICATIONS

DERWENT Abstract 2019-343109 of KR 1939225 B1 (Year: 2019).*
Japan Patent Office, Office action dated Nov. 24, 2020.
Korean Patent Office, Office action dated Apr. 20, 2020.

*Primary Examiner* — Jeffrie R Lund
(74) *Attorney, Agent, or Firm* — Li & Cai Intellectual Property (USA) Office (57) ABSTRACT

The inventive concept relates to an apparatus for processing a substrate. The substrate processing apparatus includes a scatter that is disposed over a baffle and that separates plasma and impurities. The scatter includes a plate having a first opening formed in a central area thereof when viewed from above and a collision block that is disposed over the first opening to face the first opening and that collides with plasma supplied from a plasma generation unit and impurities.

12 Claims, 9 Drawing Sheets

(56) References Cited

U.S. PATENT DOCUMENTS

| | | | | |
|---|---|---|---|---|
| 2012/0132228 A1* | 5/2012 | Yanai | ................ | H01J 37/32449 |
| | | | | 134/1.2 |
| 2014/0190635 A1* | 7/2014 | Lee | ................... | H01J 37/32357 |
| | | | | 156/345.48 |
| 2015/0206723 A1* | 7/2015 | Yoo | ................... | H01J 37/32935 |
| | | | | 156/345.26 |
| 2016/0218012 A1* | 7/2016 | Shimamoto | ......... | H01L 21/6719 |
| 2020/0075294 A1* | 3/2020 | Chen | ................ | H01J 37/32633 |
| 2020/0350147 A1* | 11/2020 | Wang | ................ | H01L 21/67167 |
| 2021/0134567 A1* | 5/2021 | Yoo | ................... | H01J 37/32724 |

FOREIGN PATENT DOCUMENTS

| | | | |
|---|---|---|---|
| JP | H0684837 | A | 3/1994 |
| JP | 2000508842 | A | 7/2000 |
| JP | 2003318155 | A | 11/2003 |
| JP | 2008091805 | A | 4/2008 |
| JP | 2008177568 | A | 7/2008 |
| JP | 2010034532 | A | 2/2010 |
| JP | 2013026622 | A | 2/2013 |
| JP | 2017-052988 | A | 3/2017 |
| KR | 10-0587629 | B1 | 6/2006 |
| KR | 10-1939225 | B1 | 4/2019 |
| TW | 201501205 | A | 1/2015 |
| TW | 201523689 | A | 6/2015 |
| TW | 201606844 | A | 2/2016 |
| TW | 201839846 | A | 11/2018 |

\* cited by examiner

SUBSTRATE PROCESSING APPARATUS

CROSS-REFERENCE TO RELATED APPLICATIONS

A claim for priority under 35 U.S.C. § 119 is made to Korean Patent Application No. 10-2019-0050677 filed on Apr. 30, 2019, in the Korean Intellectual Property Office, the entire contents of which are hereby incorporated by reference.

BACKGROUND

Embodiments of the inventive concept described herein relate to a substrate processing apparatus, and more particularly, relate to a substrate processing apparatus for processing a substrate using plasma.

Plasma refers to an ionized gaseous state of matter containing ions, radicals, and electrons and is generated by heating a neutral gas to a very high temperature or subjecting a neutral gas to a strong electric field or an RF electromagnetic field. Semiconductor device manufacturing processes include an ashing or etching process of removing a thin film on a substrate using plasma. The ashing or etching process is performed by allowing ions and radicals contained in the plasma to collide or react with the film on the substrate.

Figure 1:
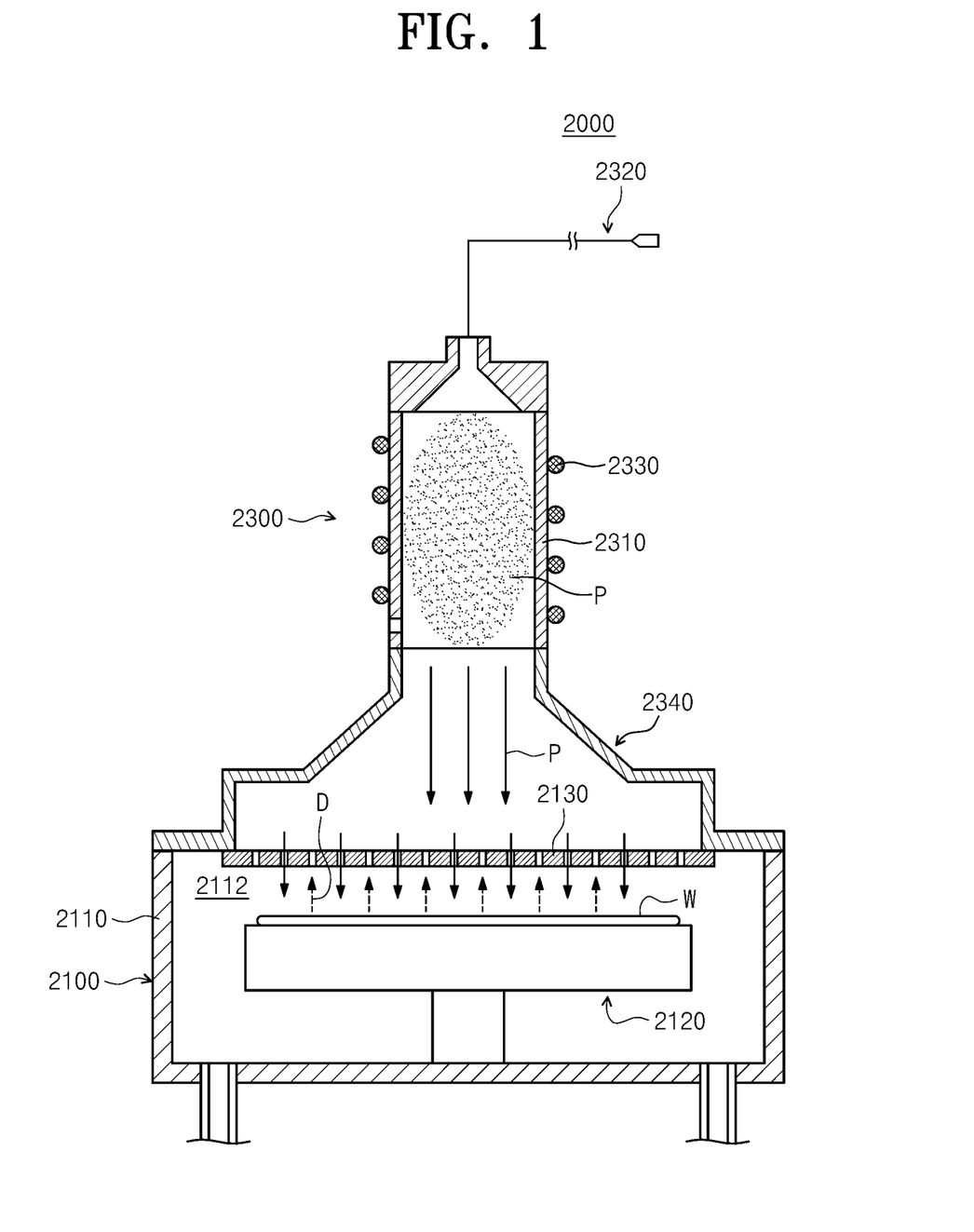
FIG. 1 is a view illustrating a typical plasma processing apparatus.

FIG. 1 is a view illustrating a typical plasma processing apparatus. Referring to FIG. 1, the plasma processing apparatus 2000 has a processing unit 2100 and a plasma generation unit 2300.

The processing unit 2100 processes a substrate W using plasma generated by the plasma generation unit 2300. The processing unit 2100 includes a housing 2110, a support unit 2120, and a baffle 2130. The housing 2110 has an inner space 2112, and the support unit 2120 supports the substrate W in the inner space 2112. The baffle 2130 has a plurality of holes formed therein and is disposed over the support unit 2120.

The plasma generation unit 2300 generates plasma. The plasma generation unit 2300 includes a plasma generation chamber 2310, a gas supply unit 2320, a power applying unit 2330, and a diffusion chamber 2340. A process gas supplied by the gas supply unit 2320 is excited into a plasma state by RF power applied by the power applying unit 2330. The generated plasma is supplied into the inner space 2112 through the diffusion chamber 2340.

Figure 2:
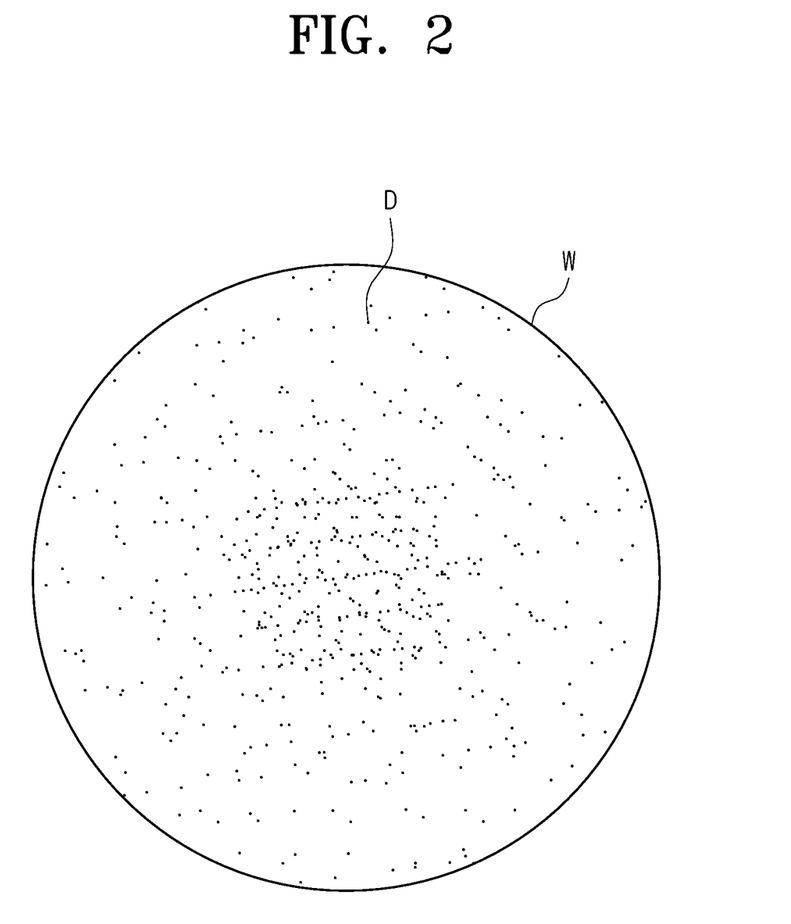
FIG. 2 is a view illustrating a substrate processed by the plasma processing apparatus of FIG. 1.

However, impurities D such as reaction by-products, particles, or the like are generated in a process of processing the substrate W using the plasma. The impurities D flow back to the plasma generation unit 2300 from the inner space 2112. The impurities D introduced into the plasma generation unit 2300 impede a collision of electrons with the process gas in the plasma generation chamber 2310 to deteriorate plasma generation efficiency. Furthermore, the impurities D are introduced into the processing space 2112 of the housing 2100 again together with plasma generated after the impurities D are introduced into the plasma generation chamber 2310. As illustrated in FIG. 2, the impurities D introduced into the processing space 2112 are attached to the top side of the substrate W to deteriorate substrate processing efficiency.

SUMMARY

Embodiments of the inventive concept provide a substrate processing apparatus for efficiently processing a substrate.

Furthermore, embodiments of the inventive concept provide a substrate processing apparatus for preventing impurities generated during substrate processing using plasma from being introduced into a plasma generation unit.

In addition, embodiments of the inventive concept provide a substrate processing apparatus for separating impurities introduced into a processing unit from ions and radicals supplied into the processing unit and discharging the separated impurities to the outside.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for processing a substrate includes a housing having a processing space formed therein, a support unit that supports the substrate in the processing space, a plasma generation unit that is located above the support unit and that supplies plasma into the processing space, a baffle that is disposed between the support unit and the plasma generation unit and that allows the plasma to pass through, and a scatter that is disposed over the baffle and that separates the plasma and impurities. The scatter includes a plate having a first opening formed in a central area thereof when viewed from above and a collision block that is disposed over the first opening to face the first opening and that collides with the plasma supplied from the plasma generation unit and the impurities.

According to an embodiment, the plate may have a second opening formed in an edge area thereof when viewed from above.

According to an embodiment, the second opening may have an arc shape when viewed from above.

According to an embodiment, a plurality of second openings may be formed in the edge area of the plate and may be spaced apart from each other along a circumferential direction of the plate.

According to an embodiment, an area between the first opening and the second opening(s) may be provided as a blocking area.

According to an embodiment, the housing may have an exhaust hole formed in the bottom thereof to release a gas from the processing space, and the exhaust hole, when viewed from above, may be formed to overlap the second opening or may be formed outward of the second opening.

According to an embodiment, the collision block may include a collision part, and the collision part, when viewed in a vertical section, may have a shape in which an upper end is downwardly inclined toward the outside from the center.

According to an embodiment, the collision block may include a guide part, and the guide part may be inserted into the first opening.

According to an embodiment, the guide part, when viewed in a vertical section, may have a shape in which a lower end is downwardly inclined toward the center from the outside.

According to an embodiment, the collision block, when viewed in a vertical section, may have a shape in which an upper portion is flat.

According to an embodiment, the baffle may have a plurality of holes formed therein and may include an upper surface and a lower surface when viewed in a vertical section, and the upper surface may be formed to be a curved surface.

According to an embodiment, the curved surface may be bent to be convex upward.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise" and "have" when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 3 to 12.

Figure 3:
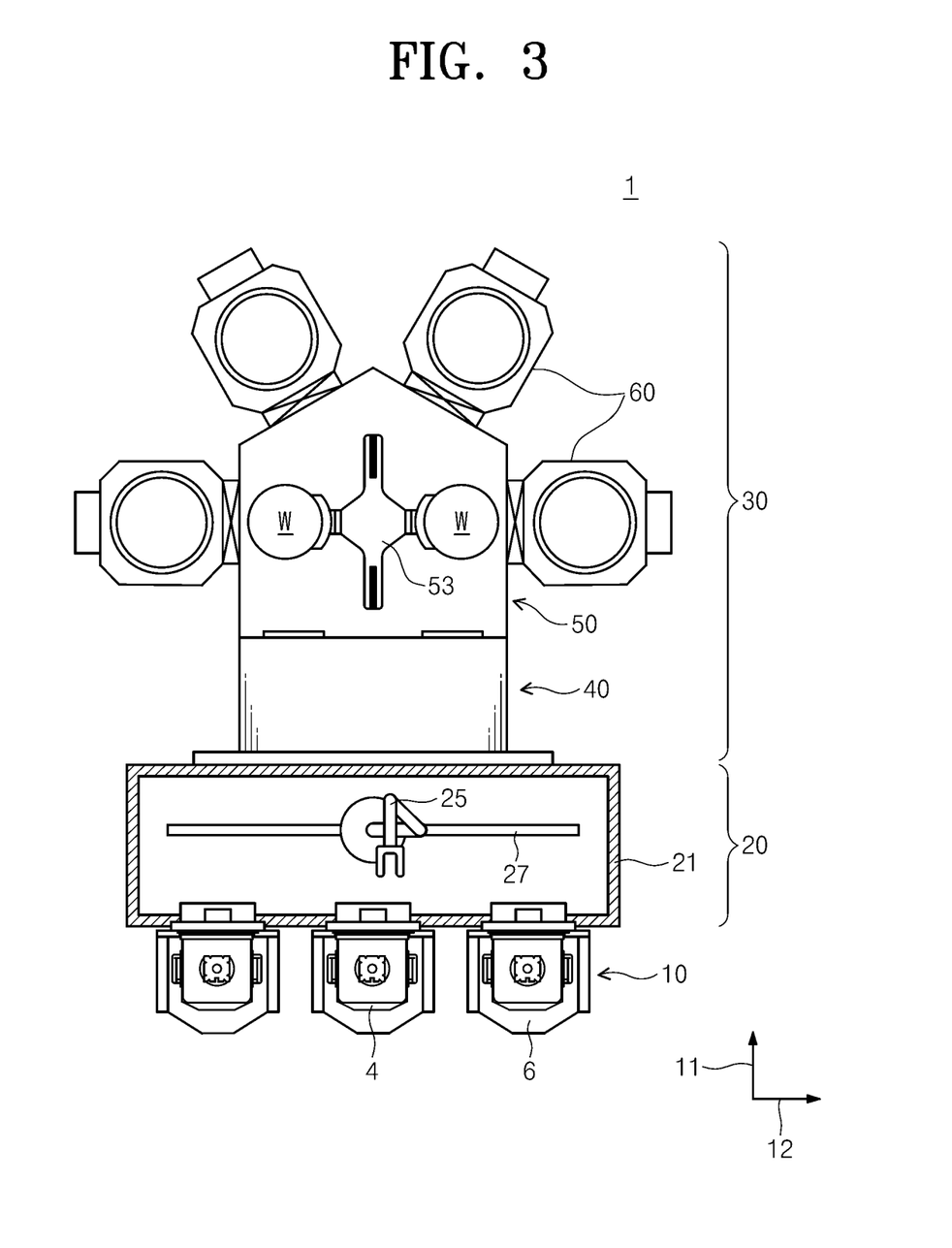
FIG. 3 is a schematic view illustrating substrate processing equipment of the inventive concept.

FIG. 3 is a schematic view illustrating substrate processing equipment of the inventive concept. Referring to FIG. 3, the substrate processing equipment 1 has an equipment front end module (EFEM) 20 and a processing module 30. The equipment front end module 20 and the processing module 30 are arranged in one direction.

The equipment front end module 20 has a load port 10 and a transfer frame 21. The load port 10 is disposed in the front of the equipment front end module 20 in a first direction 11. The load port 10 has a plurality of supports 6. The supports 6 are arranged in a row in a second direction 12, and carriers 4 (e.g., cassettes, FOUPs, or the like) in which substrates W to be processed and completely processed substrates W are received are placed on the supports 6. The substrates W to be processed and the completely processed substrates W are received in the carriers 4. The transfer frame 21 is disposed between the load port 10 and the processing module 30. The transfer frame 21 includes a first transfer robot 25 that is disposed inside the transfer frame 21 and that transfers the substrates W between the load port 10 and the processing module 30. The first transfer robot 25 moves along a transfer rail 27 arranged in the second direction 12 and transfers the substrates W between the carriers 4 and the processing module 30.

The processing module 30 includes a load-lock chamber 40, a transfer chamber 50, and process chambers 60.

The load-lock chamber 40 is disposed adjacent to the transfer frame 21. For example, the load-lock chamber 40 may be disposed between the transfer chamber 50 and the equipment front end module 20. The load-lock chamber 40 provides a space where substrates W to be processed stand by before transferred to the process chambers 60 or completely processed substrates W stand by before transferred to the equipment front end module 20.

The transfer chamber 50 is disposed adjacent to the load-lock chamber 40. The transfer chamber 50 has a body in a polygonal shape when viewed from above. Referring to FIG. 3, the transfer chamber 50 has a pentagonal body when viewed from above. The load-lock chamber 40 and the plurality of process chambers 60 are disposed around the body. The body has, in sidewalls thereof, passages (not illustrated) through which substrates W enter or leave the transfer chamber 50, and the passages connect the transfer chamber 50 and the load-lock chamber 40 or the process chambers 60. Doors (not illustrated) are provided for the respective passages to open/close the passages and hermetically seal the interior of the transfer chamber 50. A second transfer robot 53 is disposed in the inner space of the transfer chamber 50 and transfers substrates W between the load-lock chamber 40 and the process chambers 60. The second transfer robot 53 transfers unprocessed substrates W standing by in the load-lock chamber 40 to the process chambers 60, or transfers completely processed substrates W to the load-lock chamber 40. Furthermore, the second transfer robot 53 transfers a substrate W between the process chambers 60 to sequentially provide the substrate W to the plurality of process chambers 60. As illustrated in FIG. 3, when the transfer chamber 50 has a pentagonal body, the load-lock chamber 40 is disposed on a sidewall adjacent to the equipment front end module 20, and the process chambers 60 are continuously disposed on the remaining sidewalls. The transfer chamber 50 may be provided in various shapes according to required processing modules, in addition to the aforementioned shape.

The process chambers 60 are disposed around the transfer chamber 50. The plurality of process chambers 60 may be provided. In the process chambers 60, processes are performed on substrates W, respectively. The process chambers 60 process the substrates W transferred from the second transfer robot 53 and provide the completely processed substrates W to the second transfer robot 53. The processes performed in the respective process chambers 60 may differ from each other.

Hereinafter, among the process chambers 60, a substrate processing apparatus 1000 that performs a plasma process will be described in detail.

Figure 4:
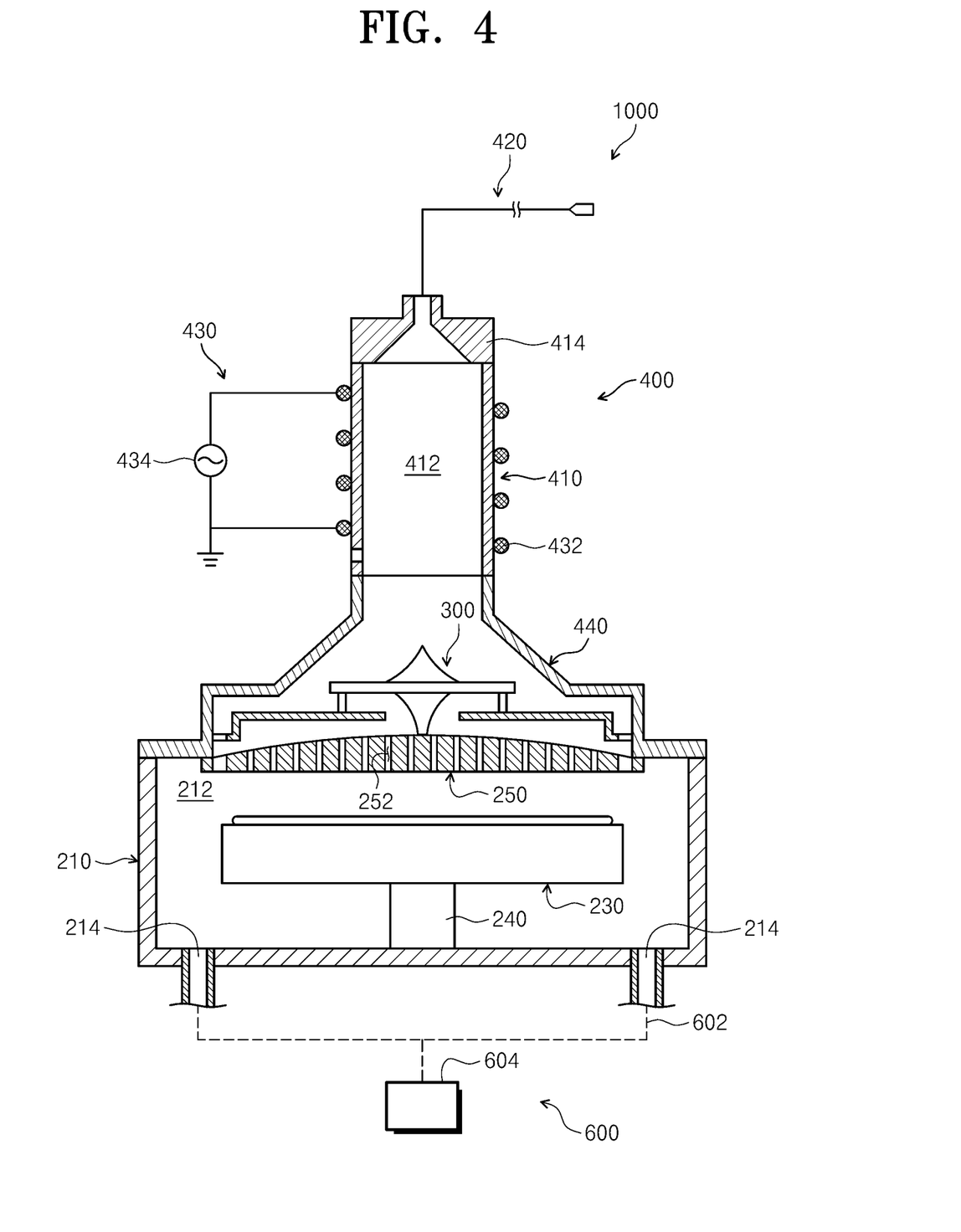
FIG. 4 is a view illustrating a substrate processing apparatus of FIG. 3.

FIG. 4 is a view illustrating the substrate processing apparatus of FIG. 3. Referring to FIG. 4, the substrate processing apparatus 1000 performs a predetermined process on a substrate W using plasma. For example, the substrate processing apparatus 1000 may etch a thin film on the substrate W. The thin film may be various types of films such as a poly silicon film, a silicon oxide film, a silicon nitride film, and the like. Alternatively, the thin film may be a native oxide film or a chemically generated oxide film.

The substrate processing apparatus 1000 has a processing unit 200, a plasma generation unit 400, and an exhaust unit 600.

The processing unit 200 provides a space in which the substrate W is placed and the process is performed on the substrate W. The plasma generation unit 400 located outside the processing unit 200 generates plasma from a process gas and supplies the plasma into the processing unit 200. The exhaust unit 600 discharges gases staying in the processing unit 200 and reaction by-products generated during the substrate processing to the outside and maintains the pressure in the processing unit 200 at a set pressure.

The processing unit 200 has a housing 210, a support unit 230, and a baffle 250.

The housing 210 has a processing space 212 formed therein, in which the substrate processing is performed. The housing 210 may be open at the top thereof and may have an opening (not illustrated) that is formed in a sidewall thereof. The substrate W is placed in, or extracted from, the housing 210 through the opening. The opening may be opened or closed by an opening/closing member such as a door (not illustrated). Furthermore, exhaust holes 214 are formed in the bottom of the housing 210. Gases in the processing space 212 may be released through the exhaust holes 214. The exhaust holes 214 may be connected with components included in the exhaust unit 600 that will be described below. Furthermore, when viewed from above, the exhaust holes 214 may be formed to overlap second openings 314 that will be described below, or may be formed outward of the second openings 314.

The support unit 230 supports the substrate W in the processing space 212. The support unit 230 is supported by a support shaft 240. The substrate W is placed on an upper surface of the support unit 230. The support unit 230 is connected with an external power supply and generates static electricity by applied power. The generated static electricity may fix the substrate W to the support unit 230.

The support shaft 240 may move an object. For example, the support shaft 240 may vertically move the substrate W. For example, the support shaft 240 may be combined with the support unit 230 and may raise or lower the support unit 230 to move the substrate W.

The baffle 250 is located over the support unit 230 to face the support unit 230. The baffle 250 may be disposed between the support unit 230 and the plasma generation unit 400. The plasma generated by the plasma generation unit 400 passes through a plurality of holes 252 formed in the baffle 250.

The baffle 250 allows the plasma flowing into the processing space 212 to be uniformly supplied to the substrate W. The holes 252 formed in the baffle 250 are provided as through-holes extending from the top side of the baffle 250 to the bottom side thereof and are uniformly formed over the entire area of the baffle 250. Furthermore, among the holes 252 formed in the baffle 250, the outermost holes 252 may be larger in size than the other holes 252. When viewed in a vertical section, the baffle 250 may include an upper surface and a lower surface, and the upper surface may be formed to be a curved surface. In addition, the curved upper surface may have a shape that is bent to be convex upward.

The plasma generation unit 400 is located above the housing 210. The plasma generation unit 400 excites the process gas into plasma and supplies the generated plasma into the processing space 212. The plasma generation unit 400 includes a plasma chamber 410, a gas supply unit 420, a power applying unit 430, and a diffusion chamber 440.

The plasma chamber 410 has a plasma generation space 412 formed therein, and the plasma generation space 412 is open at the top and the bottom thereof. An upper end of the plasma chamber 410 is hermetically sealed from the outside by a gas supply port 414. The gas supply port 414 is connected with the gas supply unit 420. The process gas is supplied into the plasma generation space 412 through the gas supply port 414. The gas supplied into the plasma generation space 412 is introduced into the processing space 212 through the baffle 250.

The power applying unit 430 applies RF power to the plasma generation space 412. The power applying unit 430 includes an antenna 432 and a power supply 434.

The antenna 432 is an inductively coupled plasma (ICP) antenna and has a coil shape. The antenna 432 is wound around the plasma chamber 410 a plurality of times. The antenna 432 is wound around the plasma chamber 410 to correspond to the plasma generation space 412. The power supply 434 supplies RF power to the antenna 432. The RF power supplied to the antenna 432 is applied to the plasma generation space 412. An induced electric field is formed in the plasma generation space 412 by high-frequency current, and the process gas in the plasma generation space 412 obtains energy required for ionization from the induced electric field and is converted into a plasma state.

The diffusion chamber 440 diffuses the plasma generated in the plasma chamber 410. The diffusion chamber 440 may have an overall inverted funnel shape and may be open at the top and the bottom thereof. The plasma generated in the plasma chamber 410 may be diffused while passing through the diffusion chamber 440 and may be introduced into the processing space 212 through the baffle 250.

The exhaust unit 600 may suction the plasma and impurities inside the processing unit 200. The exhaust unit 600 may include an exhaust line 602 and a pressure reducing member 604. The exhaust line 602 is connected with the exhaust holes 214 formed in the bottom of the housing 210. Furthermore, the exhaust line 602 may be connected with the pressure reducing member 604 that provides reduced pressure. Accordingly, the pressure reducing member 604 may provide reduced pressure to the processing space 212. The pressure reducing member 604 may be a pump. The pressure reducing member 604 may discharge the plasma and the impurities that remain in the processing space 212, to the outside of the housing 210. In addition, the pressure reducing member 604 may provide reduced pressure to maintain the pressure in the processing space 212 at a preset pressure.

A scatter 300 may be disposed over the baffle 250. The scatter 300 may be coupled to an inner wall of the diffusion chamber 440. The scatter 300 is disposed over the baffle 250 and separates the plasma generated in the plasma chamber 410 and the impurities.

Hereinafter, a configuration of the scatter 300 according to an embodiment of the inventive concept will be described in detail with reference to FIGS. 5 to 8.

Figure 5:
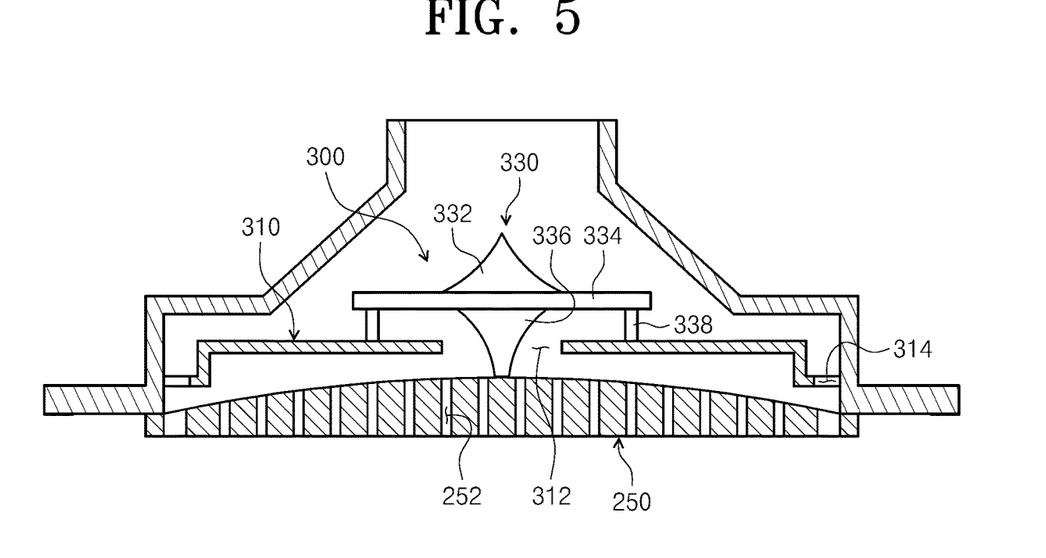
FIG. 5 is a view illustrating a scatter according to an embodiment of the inventive concept.
Figure 6:
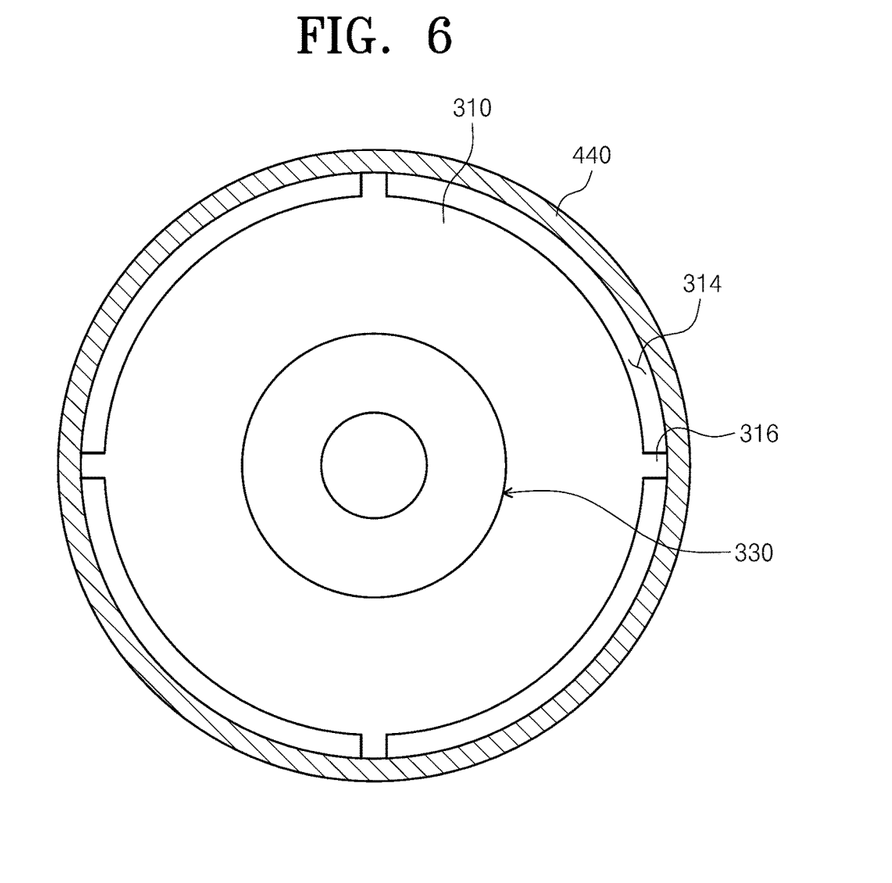
FIG. 6 is a top view illustrating the scatter of FIG. 5.

FIG. 5 is a view illustrating the scatter according to an embodiment of the inventive concept, and FIG. 6 is a top view illustrating the scatter of FIG. 5. Referring to FIGS. 5 and 6, the scatter 300 may include a plate 310 and a collision block 330.

The plate 310 is disposed over the baffle 250. The plate 310 may have a first opening 312 formed in the central area of the plate 310 when viewed from above. The first opening 312 may be formed in a position corresponding to the central area of the substrate W. The first opening 312 may have a circular shape when viewed from above.

Furthermore, the plate 310 may have the second openings 314 formed in the edge area of the plate 310 when viewed from above. The plurality of second openings 314 may be formed. The second openings 314 may have an arc shape when viewed from above. The second openings 314, when viewed from above, may overlap the outermost holes 252 among the plurality of holes 252 formed in the baffle 250. The area between the first opening 312 and the second openings 314 may be provided as a blocking area where no hole is formed.

In addition, the plate 310 may have coupling parts 316. The coupling parts 316 may be spaced at equal spaces from each other when viewed from above. Furthermore, the plate 310 may be coupled to the inner wall of the diffusion chamber 440 by the coupling parts 316.

The collision block 330 collides with ions and radicals generated in the plasma chamber 410 and impurities introduced into the plasma chamber 410. The collision block 330 may be provided in a position corresponding to the central area of the substrate W. The collision block 330 may be provided in a position corresponding to the longitudinal central axis of the plasma chamber 410. The collision block 330 may include a collision part 332, an inducing part 334, a guide part 336, and a support part 338.

The collision part 332 collides with the ions, the radicals, and the impurities. Flow paths of the ions, the radicals, and the impurities that collide with the collision part 332 are changed from a downward direction to a lateral direction. When viewed in a vertical section, the collision part 332 may have a shape in which an upper end is downwardly inclined toward the outside from the center. For example, the collision part 332 may have an overall conical shape. Furthermore, when viewed in the vertical section, the upper end of the collision part 332 may have a curved surface or a flat surface.

The inducing part 334 may be provided under the collision part 332. The inducing part 334 may induce the ions, the radicals, and the impurities, which collide with the collision part 332, to flow in the outward direction. The inducing part 334 may extend from a lower end of the collision part 332. The inducing part 334 may have a circular plate shape when viewed from above. The inducing part 334 may be larger in size than the first opening 312. When viewed from above, the inducing part 334 may be provided to cover the first opening 312.

The guide part 336 is provided below the inducing part 334. The guide part 336 causes the ions and radicals flowing in the outward direction along the inducing part 334 to flow into the space between the plate 310 and the baffle 250. Furthermore, the guide part 336 may prevent flows of the ions and radicals flowing into the first opening 312 from colliding with each other to generate vortices. The guide part 336 may extend downward from a lower end of the inducing part 334. For example, the guide part 336 may extend downward from the central area of the inducing part 334. When viewed in a vertical section, the guide part 336 may have a shape in which a lower end is downwardly inclined toward the center from the outside. For example, the guide part 336 may have an overall funnel shape. Furthermore, when viewed in the vertical section, the lower end of the guide part 336 may have a curved surface or a flat surface. The guide part 336 may be inserted into the first opening 312. The lowest end of the guide part 336 may make contact with the baffle 250. Without being limited thereto, however, the lowest end of the guide part 336 may be spaced apart from the baffle 250.

The support part 338 supports the collision block 330 on the plate 310. The support part 338 may have a pin or rod shape. The support part 338 may extend from the bottom of the edge area of the inducing part 334. Alternatively, the support part 338 may be provided as a separate member and may be coupled to the bottom side of the inducing part 334 and the top side of the plate 310. Furthermore, a plurality of support parts 338 may be provided. For example, three support parts 338 may be provided. The support parts 338 may be spaced circumferentially apart from each other.

Figure 7:
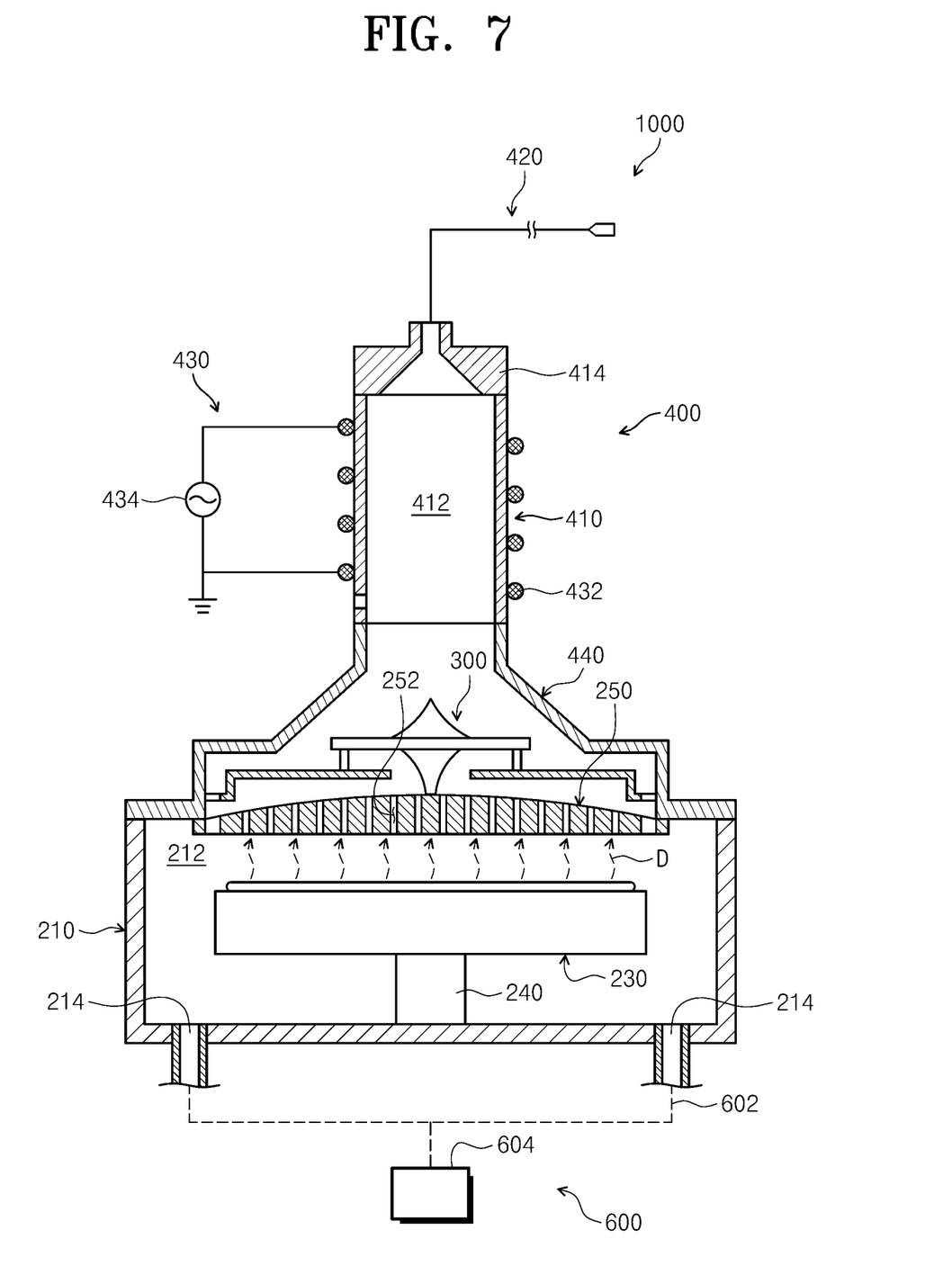
FIG. 7 is a view illustrating a state in which impurities are generated from a substrate in the substrate processing apparatus according to an embodiment of the inventive concept.

FIG. 7 is a view illustrating a state in which impurities are generated from a substrate in the substrate processing apparatus according to an embodiment of the inventive concept. Referring to FIG. 7, impurities D such as reaction byproducts, particles, and the like are generated in a process of processing the substrate W in the substrate processing apparatus 1000. The impurities D may flow back to the plasma generation space 412 from the processing space 212 when a downdraft disappears after the substrate W is completely processed. However, according to an embodiment of the inventive concept, the scatter 300 is disposed over the baffle 250. Especially, among the components of the scatter 300, the plate 310 and the inducing part 334 of the collision block 330 stop or minimize introduction of the impurities D into the plasma generation space 412 due to a reverse flow. Accordingly, the scatter 300 may minimize deterioration in plasma generation efficiency due to the introduction of the impurities D into the plasma generation space 412 and may minimize re-introduction of the impurities D into the processing space 212 and attachment of the impurities D to the substrate W.

Figure 8:
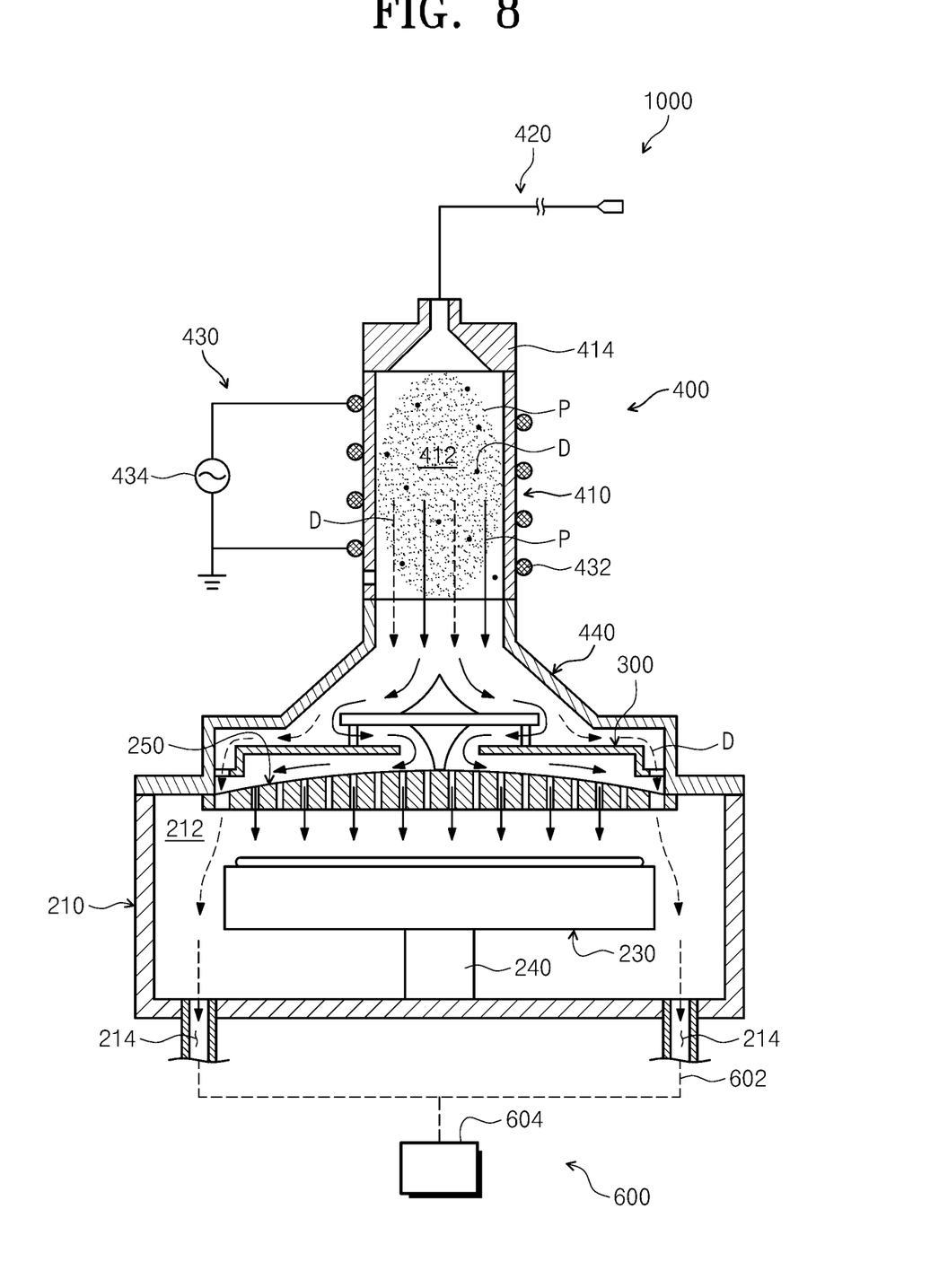
FIG. 8 is a view illustrating a flow of plasma in the substrate processing apparatus according to an embodiment of the inventive concept.

FIG. 8 is a view illustrating a flow of plasma in the substrate processing apparatus according to an embodiment of the inventive concept. Referring to FIG. 8, plasma P is generated in the plasma chamber 410. Specifically, the gas supply unit 420 supplies the process gas into the plasma generation space 412 of the plasma chamber 410, and the power applying unit 430 forms an RF electromagnet field. The process gas supplied by the gas supply unit 420 is excited into a plasma state by the RF electromagnet field. Ions and radicals contained in the plasma P are caused by the excitation of the process gas, and hence the mass of impurities D is significantly greater than the mass of the ions and radicals. Thus, the acceleration of the impurities D flowing from the plasma generation space 412 to the processing space 212 is significantly greater than the acceleration of the ions and radicals.

When the ions, the radicals, and the impurities D collide with the collision block 300, the flow paths are changed to a lateral direction. At this time, the inertia by which the impurities D continue to flow in the lateral direction is also greater than the inertia of the ions and radicals because the mass of the impurities D is significantly greater than the mass of the ions and radicals. Accordingly, the impurities D continue to flow toward the second openings 314 via the upper surface of the collision part 332, the upper surface of the inducing part 334, and the upper surface of the plate 310. Furthermore, because the mass of the ions and radicals is significantly less than the mass of the impurities D, the inertia by which the ions and radicals continue to flow in the lateral direction is also smaller than the inertia of the impurities D. Accordingly, most of the ions and radicals flow toward the first opening 312 by reduced pressure applied to the processing space 212. The ions and radicals passing through the first opening 312 may be uniformly supplied to the entire area of the substrate W while flowing outward along the curved upper surface of the baffle 250. That is, the substrate processing apparatus 1000 according to an embodiment of the inventive concept may separate the ions/radicals and the impurities D that flow from the plasma chamber 410 to the processing space 212. The separated impurities D may be discharged to the outside of the substrate processing apparatus 1000 through the exhaust holes 214 formed in the bottom of the housing 210. As a result, the substrate processing apparatus 1000 may minimize re-introduction of the impurities D, which is introduced into the plasma chamber 410, into the processing space 212 and attachment of the impurities D to the substrate W.

Figure 9:
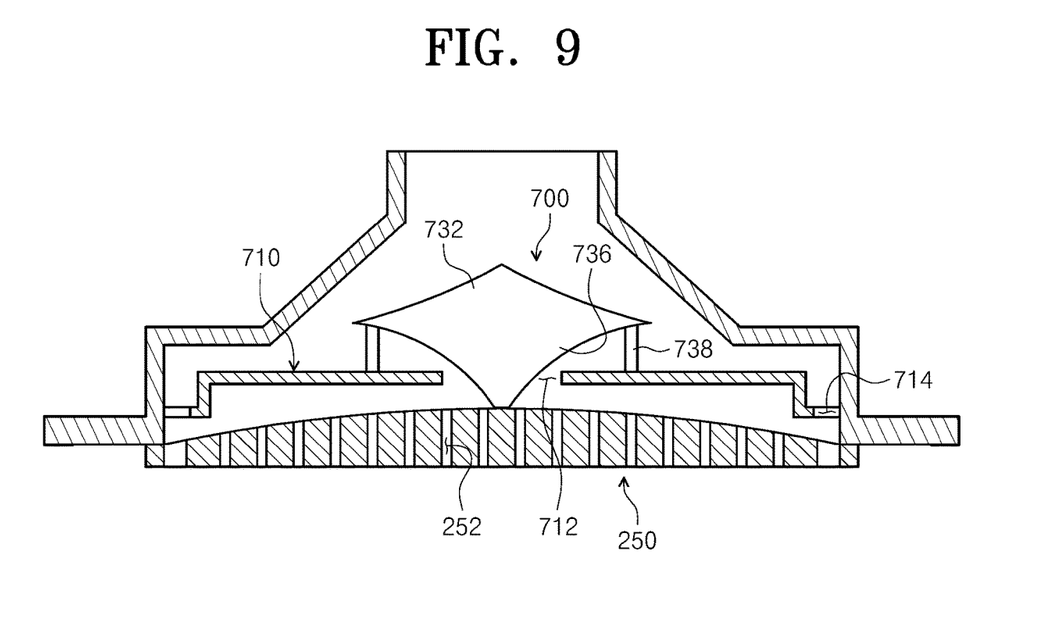
FIG. 9 is a sectional view illustrating a scatter according to another embodiment of the inventive concept.
Figure 10:
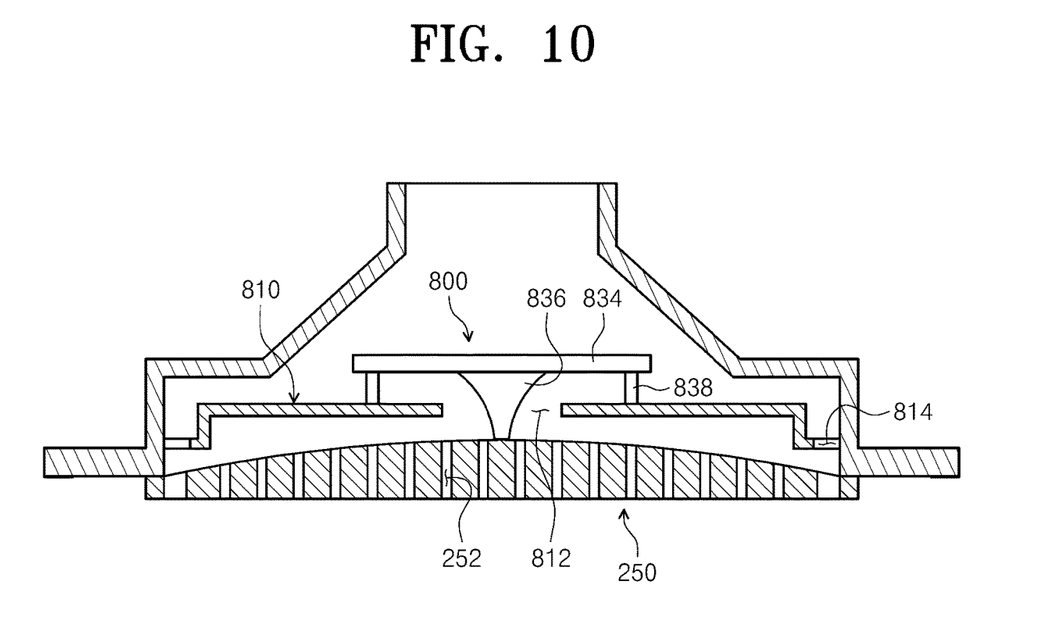
FIG. 10 is a sectional view illustrating a scatter according to another embodiment of the inventive concept.
Figure 11:
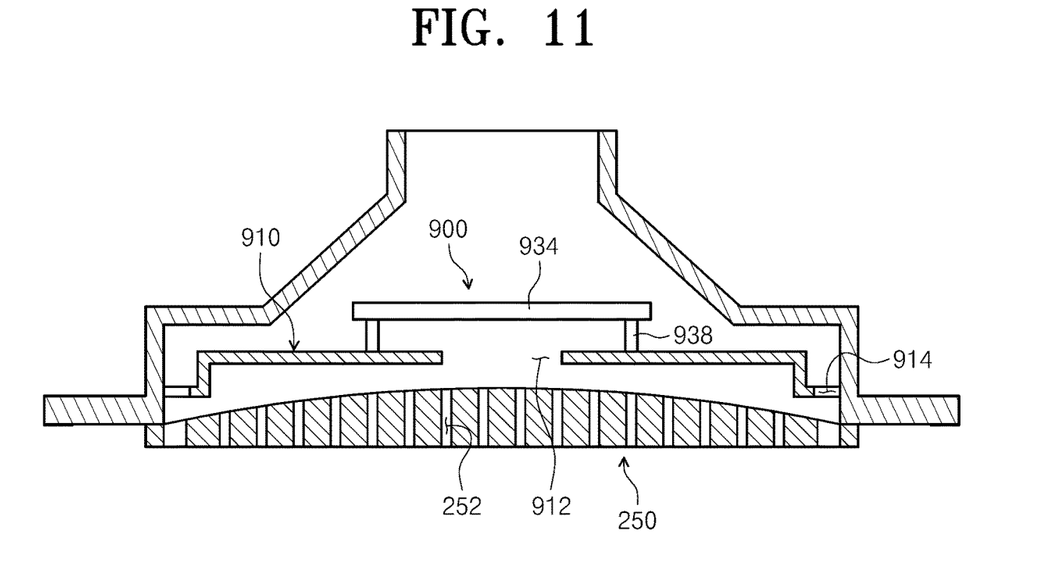
FIG. 11 is a sectional view illustrating a scatter according to another embodiment of the inventive concept.

Although it has been exemplified in the above-described embodiment that the collision block 300 has the collision part 332, the inducing part 334, and the guide part 336, the inventive concept is not limited thereto. For example, as illustrated in FIG. 9, a collision block 700 may have only a collision part 732 and a guide part 736. Alternatively, as illustrated in FIG. 10, a collision block 800 may have only an inducing part 834 and a guide part 836. In another case, as illustrated in FIG. 11, a collision block 900 may have only an inducing part 934. Structures and functions of support parts 738, 838, and 938 are the same as, or similar to, the above-described contents. Therefore, detailed descriptions thereabout will be omitted.

Figure 12:
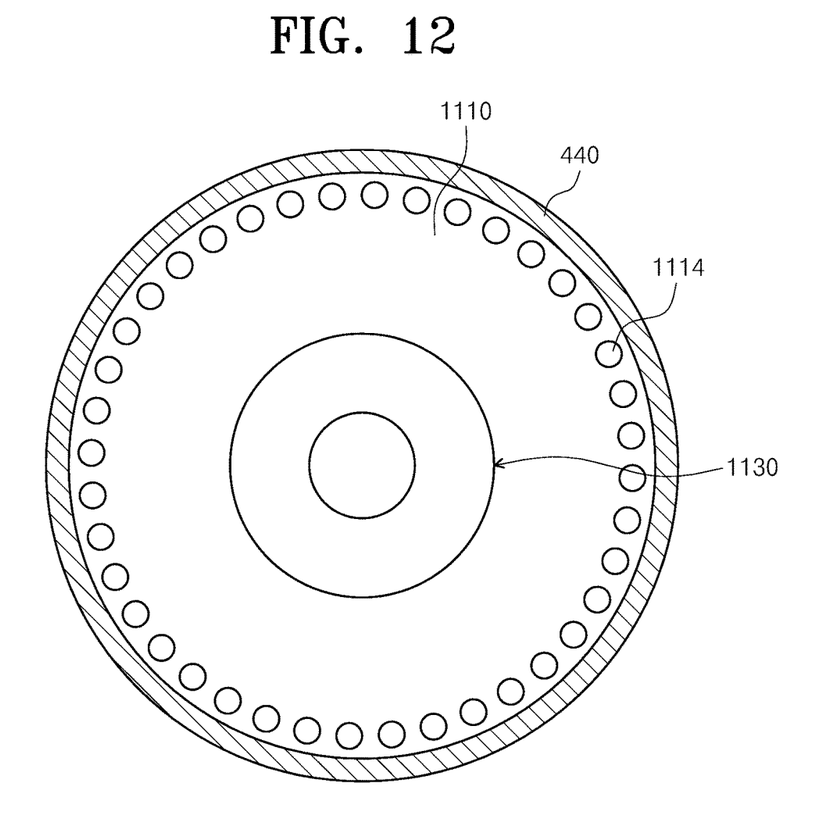
FIG. 12 is a plan view illustrating a scatter according to another embodiment of the inventive concept.

Although it has been exemplified in the above-described embodiment that the second openings 314 formed in the edge area of the plate 310 have an arc shape, the inventive concept is not limited thereto. For example, as illustrated in FIG. 12, a plurality of second openings 1114 may be formed in a plate 1110 and may have a circular shape when viewed from above. Furthermore, the second openings 1114 may be spaced at equal spaces from each other in the circumferential direction. The remaining components of the plate 1110 are the same as, or similar to, those of the above-described plate 310. Therefore, detailed descriptions thereabout will be omitted.

The apparatus that performs an ashing process on a substrate has been exemplified in the above-described embodiment. Without being limited thereto, however, the inventive concept may be applied to various processing apparatuses that use plasma and have a support unit. For example, the above-described support unit and the substrate processing apparatus including the same may be applied to an apparatus that performs a deposition process or an etching process using plasma.

The inventive concept may improve substrate processing efficiency.

Furthermore, the inventive concept may minimize introduction of impurities generated during substrate processing using plasma into the plasma generation unit.

In addition, the inventive concept may separate impurities introduced into the processing unit from ions and radicals supplied into the processing unit and may discharge the separated impurities to the outside, thereby minimizing attachment of the impurities to a substrate.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe the exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
    a housing having a processing space formed therein;
    a support unit configured to support the substrate in the processing space;
    a plasma generation unit located above the support unit and configured to supply plasma into the processing space;
    a baffle disposed between the support unit and the plasma generation unit and configured to allow the plasma to pass through; and
    a scatter disposed over the baffle and configured to separate the plasma and impurities,
    wherein the scatter includes:
    a plate having a first opening formed in a central area thereof when viewed from above; and
    a collision block disposed over the first opening to face the first opening and configured to collide with the plasma supplied from the plasma generation unit and the impurities.

2. The apparatus of claim 1, wherein the plate has a second opening formed in an edge area thereof when viewed from above.

3. The apparatus of claim 2, wherein the second opening has an arc shape when viewed from above.

4. The apparatus of claim 3, wherein an area between the first opening and the second opening(s) is provided as a blocking area.

5. The apparatus of claim 2, wherein a plurality of second openings are formed in the edge area of the plate and spaced apart from each other along a circumferential direction of the plate.

6. The apparatus of claim 2, wherein the housing has an exhaust hole formed in the bottom thereof to release a gas from the processing space, and     wherein the exhaust hole, when viewed from above, is formed to overlap the second opening or formed outward of the second opening.

7. The apparatus of claim 1, wherein the collision block includes a collision part, and     wherein the collision part, when viewed in a vertical section, has a shape in which an upper end is downwardly inclined toward the outside from the center.

8. The apparatus of claim 1, wherein the collision block includes a guide part, and     wherein the guide part is inserted into the first opening.

9. The apparatus of claim 8, wherein the guide part, when viewed in a vertical section, has a shape in which a lower end is downwardly inclined toward the center from the outside.

10. The apparatus of claim 1, wherein the collision block, when viewed in a vertical section, has a shape in which an upper portion is flat.

11. The apparatus of claim 1, wherein the baffle has a plurality of holes formed therein and includes an upper surface and a lower surface when viewed in a vertical section, and     wherein the upper surface is formed to be a curved surface.

12. The apparatus of claim 11, wherein the curved surface is bent to be convex upward.

\* \* \* \* \*